United States Patent
Fettke et al.

(10) Patent No.: US 11,367,709 B2
(45) Date of Patent: Jun. 21, 2022

(54) SEMICONDUCTOR CHIP STACK ARRANGEMENT AND SEMICONDUCTOR CHIP FOR PRODUCING SUCH A SEMICONDUCTOR CHIP STACK ARRANGEMENT

(71) Applicant: PAC TECH—PACKAGING TECHNOLOGIES GMBH, Nauen (DE)

(72) Inventors: Matthias Fettke, Berlin (DE); Andrej Kolbasow, Paulinenaue (DE)

(73) Assignee: PAC TECH—PACKAGING TECHNOLOGIES GMBH, Nauen (DE)

(*) Notice: Subject to any disclaimer, the term of this patent is extended or adjusted under 35 U.S.C. 154(b) by 0 days.

(21) Appl. No.: 15/734,772

(22) PCT Filed: Jun. 5, 2018

(86) PCT No.: PCT/EP2018/064783
§ 371 (c)(1),
(2) Date: Dec. 3, 2020

(87) PCT Pub. No.: WO2019/233568
PCT Pub. Date: Dec. 12, 2019

(65) Prior Publication Data
US 2021/0193619 A1  Jun. 24, 2021

(51) Int. Cl.
*H01L 25/065* (2006.01)
*H01L 23/36* (2006.01)
(Continued)

(52) U.S. Cl.
CPC .......... *H01L 25/0657* (2013.01); *H01L 23/36* (2013.01); *H01L 23/49811* (2013.01);
(Continued)

(58) Field of Classification Search
CPC ................. H01L 25/0657; H01L 23/36; H01L 23/49811; H01L 23/49833; H01L 24/05;
(Continued)

(56) References Cited

U.S. PATENT DOCUMENTS 5,313,096 A * 5/1994 Eide ........................ H01L 23/13
257/686
5,701,031 A * 12/1997 Oguchi ............. H01L 23/49575
257/686
(Continued)

FOREIGN PATENT DOCUMENTS

DE   19626126 A1   1/1998

OTHER PUBLICATIONS

PCT International Search Report and Written Opinion, PCT/EP2018/064783, dated Jan. 10, 2019, 17 pages.

*Primary Examiner* — Mamadou L Diallo
(74) *Attorney, Agent, or Firm* — Quarles & Brady LLP

(57) ABSTRACT

A semiconductor-chip stack package includes a plurality of semiconductor chips disposed in a stack arrangement and at least one connecting substrate which connects the semiconductor chips. The semiconductor chips include a chip terminal face on a chip edge extending at least partially as a side terminal face in a side surface of the semiconductor chip. The side surfaces of the semiconductor chips provided with the side terminal face are arranged in a shared side surface plane S of the semiconductor-chip stack arrangement. The connecting substrate is arranged with a contact surface parallel to the side surface plane S of the semiconductor chips. Substrate terminal faces are formed on the contact surface for connecting a connection conductor structure formed in the connecting substrate and which are connected to the side terminal faces via a connecting material in a connection plane V1 parallel to the contact surface.

16 Claims, 3 Drawing Sheets

(51) Int. Cl.
*H01L 23/498* (2006.01)
*H01L 23/00* (2006.01)

(52) U.S. Cl.
CPC ........ *H01L 23/49833* (2013.01); *H01L 24/05* (2013.01); *H01L 24/16* (2013.01); *H01L 24/29* (2013.01); *H01L 24/73* (2013.01); *H01L 25/0652* (2013.01); *H01L 2224/05557* (2013.01); *H01L 2224/16108* (2013.01); *H01L 2224/29076* (2013.01); *H01L 2224/73253* (2013.01)

(58) Field of Classification Search
CPC ......... H01L 24/16; H01L 24/29; H01L 24/73; H01L 25/0652; H01L 2224/05557; H01L 2224/16108; H01L 2224/29076; H01L 2224/73253; H01L 24/03; H01L 24/13; H01L 2224/05572; H01L 2224/05573; H01L 2224/056; H01L 2224/16145; H01L 2224/16238; H01L 2224/17181; H01L 2224/17183; H01L 2224/32145; H01L 2224/33181; H01L 2224/81192; H01L 2225/06513; H01L 2225/06517; H01L 25/065; H01L 2224/0384; H01L 2224/0401; H01L 2224/06181; H01L 2224/06183; H01L 2224/2919; H01L 2224/94; H01L 2225/06551; H01L 21/78; H01L 24/17
See application file for complete search history.

(56) References Cited

U.S. PATENT DOCUMENTS

| | | | | |
|---|---|---|---|---|
| 5,818,107 | A * | 10/1998 | Pierson | H01L 25/0657 257/723 |
| 7,304,375 | B2 * | 12/2007 | Boon | H01L 25/50 257/686 |
| 7,598,617 | B2 | 10/2009 | Lee et al. | |
| 7,888,185 | B2 * | 2/2011 | Corisis | H01L 25/0657 438/123 |
| 2002/0009828 | A1 * | 1/2002 | Oppermann | H01L 25/0652 438/107 |
| 2002/0094607 | A1 | 7/2002 | Gebauer et al. | |
| 2002/0096760 | A1 * | 7/2002 | Simelgor | H01L 24/24 257/723 |
| 2009/0045444 | A1 * | 2/2009 | Huebner | H01L 24/73 257/296 |
| 2009/0230528 | A1 * | 9/2009 | McElrea | H01L 21/56 257/676 |
| 2012/0299191 | A1 * | 11/2012 | Camacho | H01L 23/49827 257/774 |
| 2013/0341803 | A1 * | 12/2013 | Cheah | H01L 23/3142 257/774 |
| 2016/0329271 | A1 * | 11/2016 | Katti | H01L 23/49541 |
| 2017/0186728 | A1 * | 6/2017 | Chainer | H01L 23/473 |
| 2018/0366429 | A1 * | 12/2018 | Chiu | H01L 24/16 |
| 2019/0103409 | A1 * | 4/2019 | Xu | H03K 19/17736 |
| 2019/0319010 | A1 * | 10/2019 | Jung | H01L 25/0657 |

* cited by examiner

SEMICONDUCTOR CHIP STACK ARRANGEMENT AND SEMICONDUCTOR CHIP FOR PRODUCING SUCH A SEMICONDUCTOR CHIP STACK ARRANGEMENT

CROSS-REFERENCE TO RELATED APPLICATIONS

This application is the national stage application of PCT/EP2018/064783, filed on Jun. 5, 2018, which is incorporated herein by reference in its entirety.

The disclosure at hand relates to a semiconductor-chip stack arrangement comprising a plurality of semiconductor chips disposed in a stack arrangement and at least one connecting substrate which connects the semiconductor chips, the semiconductor chips being equipped with at least one chip terminal face on at least one chip edge, the chip terminal face extending at least partially as a side terminal face in a side surface of the semiconductor chip formed on the chip edge, the side surfaces of the semiconductor chips provided with the side terminal face being arranged in a shared side surface plane of the semiconductor-chip stack arrangement, the connecting substrate being arranged with a contact surface parallel to the side surface plane of the semiconductor chips and comprising substrate terminal faces, which are formed on the contact surface for connecting a connection conductor structure formed in the connecting substrate and which are connected to the side terminal faces in an electrically conductive manner via a connecting material in a connection plane parallel to the contact surface. Furthermore, the disclosure relates to a semiconductor chip for producing a correspondent semiconductor-chip stack package.

As electronic devices become increasingly miniaturized while higher computing capacities are more and more in demand, the integration density of the semiconductor components and semiconductor component groups used in the devices also needs to fulfill more and more requirements. For compactly arranging semiconductor component groups made up of individual semiconductor chips, it is commonly known to design the semiconductor component groups as semiconductor-chip stack packages having a plurality of semiconductor chips disposed in a stack arrangement, the semiconductor chips being directly connected, as illustrated in U.S. Pat. No. 7,598,617 B2, for example, and through-silicon vias (TSV) being formed in each of the individual semiconductor chips for this purpose, the TSVs extending from an upper side of the semiconductor chip to a lower side of the semiconductor chip and correspondingly allowing the surfaces of the semiconductor chips to be contacted.

Since the TSVs cannot be directly contacted, but are instead provided with multilayered contact metallizations having a connecting material arranged thereon which is typically realized as a solder material, the stacked semiconductor chips are inevitably spaced apart from one another, the ensuing spacing leading to a significant increase in the stacking height of the semiconductor-chip stack package when a plurality of semiconductor chips are disposed in a stack arrangement. Furthermore, the connecting structure which is formed integrally in the semiconductor chips by means of the TSVs and enables the desired interconnection of the semiconductor chips leads to a higher thermal load on the semiconductor chips.

DE 196 26 126 A1 discloses a semiconductor-chip stack package whose connecting structure for interconnecting the individual semiconductor chips is realized independently of the semiconductor chips in such a manner that a flexible connecting substrate is provided which is equipped with a conductor path structure and extends along the lateral edges of the semiconductor chips disposed in a stack arrangement, the flexible design of the connecting substrate allowing a sequential production of the semiconductor-chip stack package such that each semiconductor chip is initially positioned individually opposite the connecting substrate equipped with the conductor path structure before a connection between a chip terminal face arranged on the upper side of the chip and the conductor path structure of the connecting substrate is produced.

This kind of sequential design of the semiconductor-chip stack package is required since the chip terminal faces which are contacted with the conductor path structure of the connecting substrate via the solder material are arranged on the upper side of the semiconductor chips.

The semiconductor-chip stack package disclosed in DE 196 26 126 A1 enables a reduced thermal load on the semiconductor chips owing to the external connection conductor structure which is formed in the connecting substrate for interconnecting the semiconductor chips, the stacked semiconductor chips still being required to be spaced apart due to the chip terminal faces being formed on the upper side of the semiconductor chips for contacting the semiconductor chips with the connecting substrate, this spacing, as described above, leading to a corresponding increase in the stacking height of the stack arrangement.

The object of the disclosure at hand is therefore to propose a semiconductor-chip stack package which enables a stacking height of the semiconductor-chip stack arrangement which is as small as possible when a connection conductor structure for interconnecting the semiconductor chips is realized externally.

To attain this object, the semiconductor-chip stack package according to the disclosure has the features of claim 1.

According to the disclosure, the semiconductor chips disposed in a stack arrangement of the semiconductor-chip stack package are equipped with at least one chip terminal face on at least one chip edge, the chip terminal face extending at least partially as a side terminal face in a side surface of the semiconductor chip formed on the chip edge, the side surfaces of the semiconductor chips equipped with the side terminal face being arranged in a shared side surface plane of the stack arrangement, the connecting substrate being arranged with a contact surface parallel to the side surface plane of the semiconductor chips and comprising substrate terminal faces which are formed on the contact surface for connecting a connection conductor structure formed in the connecting substrate, the substrate terminal faces being connected in an electrically conductive manner to the side terminal faces in a connection plane parallel to the contact surface via a connecting material preferably arranged on the substrate terminal faces.

Owing to the side terminal faces formed on the semiconductor chips, the semiconductor-chip stack package according to the disclosure allows realizing a stack arrangement of the semiconductor chips before the semiconductor chips have even been contacted with the connecting substrate. This enables testing the individual semiconductor chips already disposed in a stack arrangement before they are contacted with the connecting substrate. Moreover, the individual semiconductor chips of the stack arrangement can be arranged essentially directly on top of each other since a spacing which is formed between the semiconductor chips and enables contacting the semiconductor chips with the connecting substrate becomes obsolete. Forming a spacing between the stacked semiconductor chips is only necessary in case measures for mechanically connecting the semiconductor chips to one another or electrically insulating the semiconductor chips from each other to an extent surpassing the typical passivation of the chip surfaces should become necessary.

The design of the semiconductor-chip stack package according to the disclosure therefore allows producing a semiconductor-chip component group having a larger packaging density and in a particularly small number of steps since the semiconductor chips disposed in a stack arrangement are contacted with the connecting substrate without a sequential handling of the semiconductor chips. Beyond that, the semiconductor chips do not have to be contacted among each other when producing the semiconductor-chip stack package; the semiconductor chips merely have to be contacted with the shared connecting substrate so that the thermal loads introduced into the individual semiconductor chips are significantly reduced.

With regard to the design of the side terminal faces, it proves to be particularly advantageous if the side terminal faces are each formed from a separation surface of connecting bodies which are arranged in separation planes of a wafer and are cut from the wafer for realizing the separation surface when separating the semiconductor chips from the wafer. With this design, one connecting body formed in the wafer in each case serves for forming two side terminal faces of the semiconductor chips arranged contiguously in the wafer.

Preferably, connecting bodies of this kind are formed by so-called through-silicon vias (TSV) formed in the wafer so that conventional production methods can be employed for producing a wafer particularly suited for the production of the semiconductor-chip stack package according to the disclosure, a distribution pattern defined by the size of the individual semiconductor chips being chosen merely for the distribution of the TSVs in the wafer.

Preferably, the side terminal faces comprise a contact metallization applied on the side terminal faces after the semiconductor chips have been separated from the wafer so that the semiconductor chips disposed in a stack arrangement are contacted with the connecting substrate by directly contacting the side terminal faces with the connecting material applied on substrate terminal faces of the connecting substrate after a stack arrangement made up of the individual semiconductor chips has been formed. In particular, all semiconductor chips of the stack arrangement can be contacted with the connecting substrate in a single contacting step, for example by applying thermal energy synchronously to all connection points formed by the connecting material. For this purpose, it is possible to use conventional methods, such as a reflow method, as well as an indirect application of thermal energy to the connecting material via the connecting substrate, for example by subjecting the connecting substrate to radiation energy, in particular laser energy, from the rear.

It has proven to be particularly advantageous for a precise contacting of the connecting substrate with the semiconductor chips disposed in a stack arrangement if the side terminal faces have a concave contact surface for forming a contact recess.

If, beyond that, the contact surfaces of the adjacent semiconductor chips in the stack arrangement form a contact groove extending in the direction of the stacking height, positioning the connecting substrate relative to the semiconductor chips disposed above one another in a stack arrangement is even more simplified when producing the semiconductor-chip stack package.

It is particularly advantageous if the connecting material formed on the substrate terminal faces of the connecting substrate preferably before contacting the semiconductor chips with the connecting substrate forms convex contact bumps which engage in the contact recesses of the side terminal faces in such a manner that a particularly small spacing becomes possible between the contact surface of the connecting substrate and the side surfaces of the semiconductor chips disposed in a stack arrangement, thus allowing the design of a semiconductor-chip stack package which not only has a particularly small stacking height but also has a particularly small width.

For achieving an increased integration density, the chips can at least partially be equipped with at least one additional chip terminal face on their upper side and/or lower side in addition to the side terminal faces, the chip terminal face enabling forming an internal connection conductor structure which supplements the external connection conductor structure at least partially between adjacent semiconductor chips.

For forming an additional external connection interface of the semiconductor-chip stack arrangement, it is advantageous if the connecting substrate has a second contact surface opposite the contact surface, the second contact surface having substrate terminal faces for forming a second connection plane.

Preferably, the second connection plane serves for connection to a second stack arrangement of semiconductor chips in such a manner that the connecting substrate is sandwiched between the two stack arrangements, thus easily enabling "horizontally" enlarging a semiconductor-chip stack package by an additional stack arrangement of semiconductor chips.

In a further preferred embodiment, the second connection plane serves for connection to a functional substrate which can be realized as an additional semiconductor chip or in particular as a cooling substrate.

Preferably, spacer elements are arranged between the semiconductor chips for realizing a defined stacking height of the stack arrangement, wherein, in a particularly preferred embodiment, the spacer elements are realized as molded bodies, preferably as micro glass balls, in an adhesive mass connecting the semiconductor chips.

The semiconductor chip particularly suited for producing a semiconductor-chip stack arrangement according to the disclosure comprises side terminal faces which are each formed from a separation surface of connecting bodies which are arranged in dividing planes of a wafer and are cut from the wafer for forming the separation surface when separating the semiconductor chips.

Preferably, the side terminal faces comprise a contact metallization on the side terminal faces after the semiconductor chips have been separated from the wafer.

It is particularly preferred that the side terminal faces have a concave contact surface for forming a contact recess.

In the following, preferred embodiments of the semiconductor-chip stack package and of a wafer for producing the semiconductor chips particularly suited for the production of the semiconductor-chip stack package are described in further detail by means of the drawings.

Figure 1:
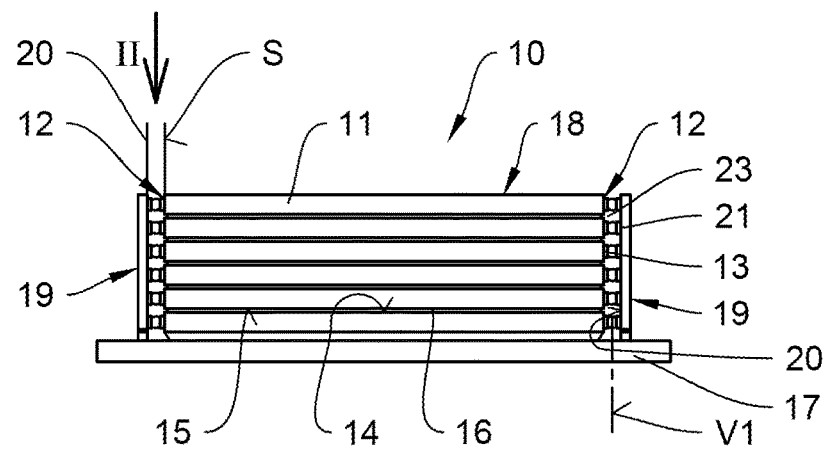
FIG. 1 is a schematic illustration of a first embodiment of a semiconductor-chip stack package having a semiconductor-chip stack arrangement arranged between two connecting substrates.

FIG. 1 shows a semiconductor-chip stack package 10 which is arranged on a terminal circuit board 17 which serves for connecting semiconductor-chip stack package 10 to additional semiconductor-chip component groups (not illustrated) of an electronic device. Semiconductor-chip stack package 10 comprises a plurality of semiconductor chips 11 disposed above one another in a stack arrangement 18, said semiconductor chips 11 in this instance being equipped with side terminal faces 13 on two opposite chip edges 12. Between an upper side 14 of a lower semiconductor chip 11 and a lower side 15 of an upper semiconductor chip 11, an electrically insulating adhesive layer 16 is in each instance provided in the embodiment at hand, said adhesive layer 16 securing the mechanical bonding of semiconductor chips 11 of stack arrangement 18 and simultaneously ensuring a mechanical bonding of semiconductor-chip stack arrangement 18 to terminal circuit board 17 when arranged between a lower side 15 of the lowest semiconductor chip 11 and its terminal circuit board 17.

For realizing semiconductor-chip stack package 10, semiconductor-chip stack arrangement 18 is contacted with two connecting substrates 19 in an electrically conductive manner via side terminal faces 13 of semiconductor chips 11 in such a manner that one side terminal face 13 in each case is connected to one substrate terminal face 21 arranged on a contact surface 20 of connecting substrate 19.

Figure 2:
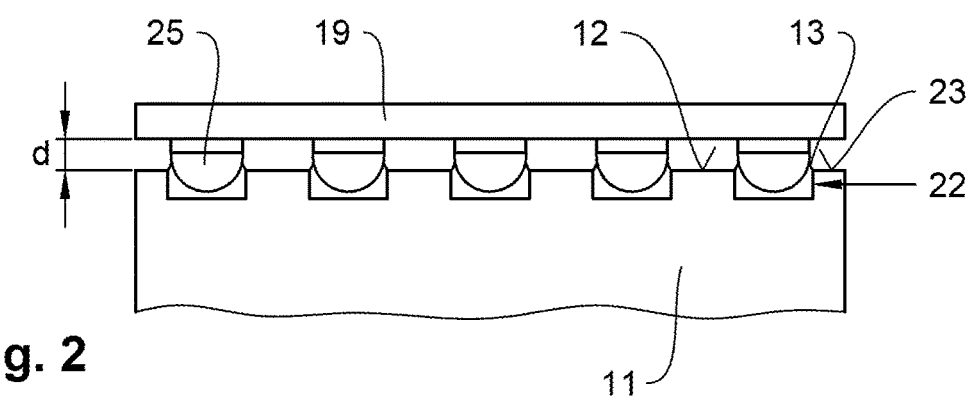
FIG. 2 is an enlarged partial illustration of the semiconductor-chip stack package illustrated in FIG. 1 according to view II.

As FIG. 2 shows in the illustrated exemplary embodiment at hand, five chip terminal faces 22 are provided on each of the opposing chip edges 12, said chip terminal faces 22 extending as a side terminal face 13 on a side surface 23 of semiconductor chip 11 with at least part of their surface. In this context, as illustrated in particular in FIG. 1, side surfaces 23 of semiconductor chips 11 disposed in stack arrangement 18 are arranged in a shared side surface plane S which is arranged parallel to contact surface 20 of connecting substrate 19 so that substrate terminal faces 21 are connected to semiconductor chips 11 in a shared connection plane V1 via a connecting material 24 arranged between substrate terminal faces 21 and side terminal faces 13, respectively.

Figure 3:
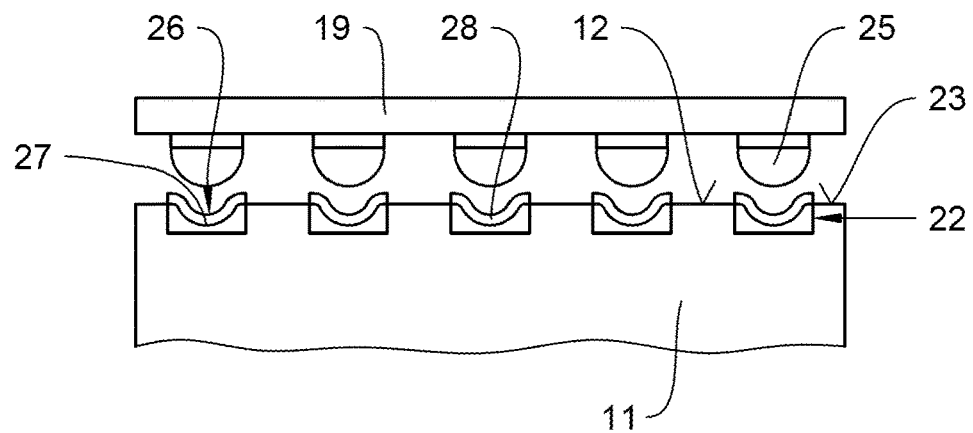
FIG. 3 is a view according to FIG. 2 before a connection between side terminal faces of a semiconductor chip and substrate terminal faces of a connecting substrate is produced.

As exemplified in the embodiment at hand, a solder material is used as a connecting material, the solder material being applied on substrate terminal faces 21 in the form of contact bumps 25, as the illustration in FIG. 3 clearly shows, said application of solder material taking place already before producing the connection of connecting substrates 19 to semiconductor-chip stack arrangement 18. As FIG. 3 further illustrates, side terminal faces 13 have a concave contact surface 27 for forming a contact recess 26 in the illustrated exemplary embodiment, said concave contact surface 27 being equipped with a contact metallization 28 to allow improved wetting of side terminal faces 13 in a subsequent contacting in which the contact bumps are fused.

As is shown in particular in FIG. 2, which illustrates the manner in which connecting substrate 19 is arranged relative to side surface 23 of semiconductor chip 11, contact recess 26 formed in side terminal face 13 allows a particularly small spacing d between contact surface 20 of connecting substrate 19 and side surface 23 of semiconductor chip 11 since contact bumps 25 are at least partially submerged in contact recesses 26 of side terminal faces 13 when forming the connection.

Figure 4:
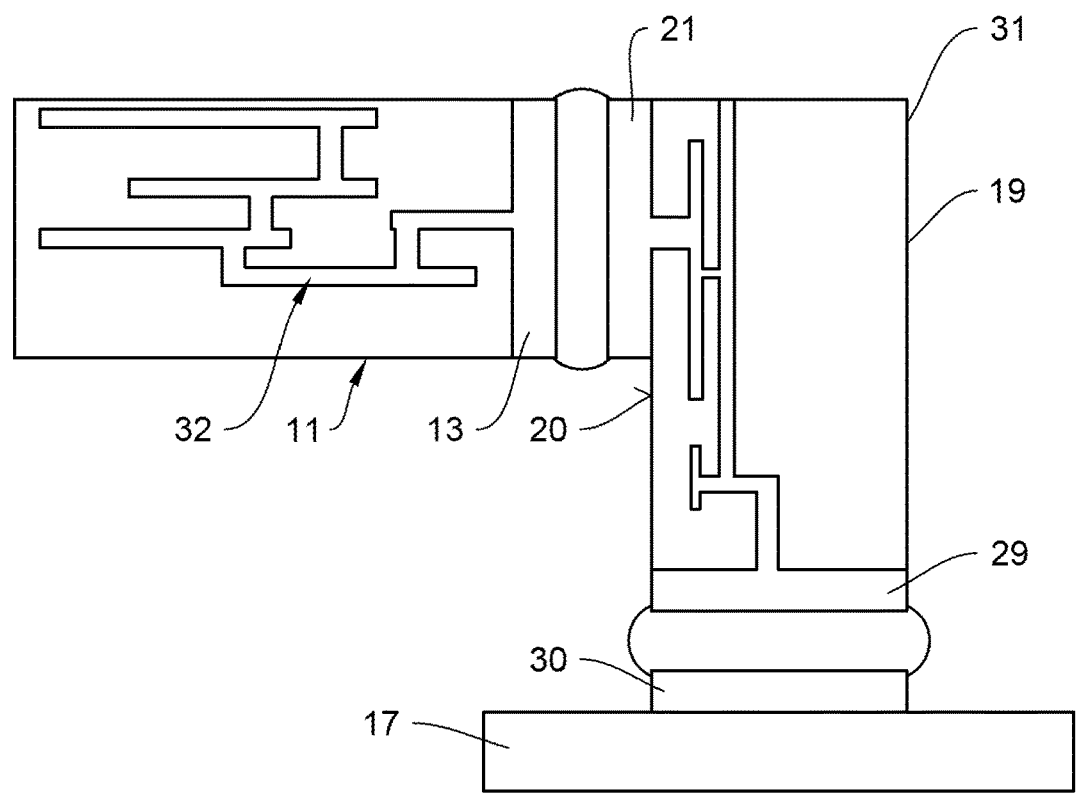
FIG. 4 is a detailed illustration of a connection produced between a substrate terminal face of the connecting substrate and a side terminal face of a semiconductor chip.

In a schematic sectional view, FIG. 4 clearly shows a contact between terminal circuit board 17 and semiconductor-chip stack package 10, the contact being produced between a side terminal face 13 of semiconductor chip 11 and a substrate terminal face 21 of connecting substrate 19 on the one hand and a further substrate terminal face 29 of connecting substrate 19 and a circuit-board terminal face 30 of terminal circuit board 17 on the other hand.

A connection conductor structure 31 formed in connecting substrate 19 allows the connection between terminal circuit board 17 and all semiconductor chips 11 which are connected to connecting substrate 19 in an electrically conductive manner via their side terminal faces 13. Substrate terminal faces 21 arranged in contact surface 20 of connecting substrate 19 in turn allow connecting substrate 19 to be contacted with the integrated circuits (not further illustrated) of semiconductor chips 11 which are formed in internal conductor path structures 32 of semiconductor chips 11.

Figure 5:
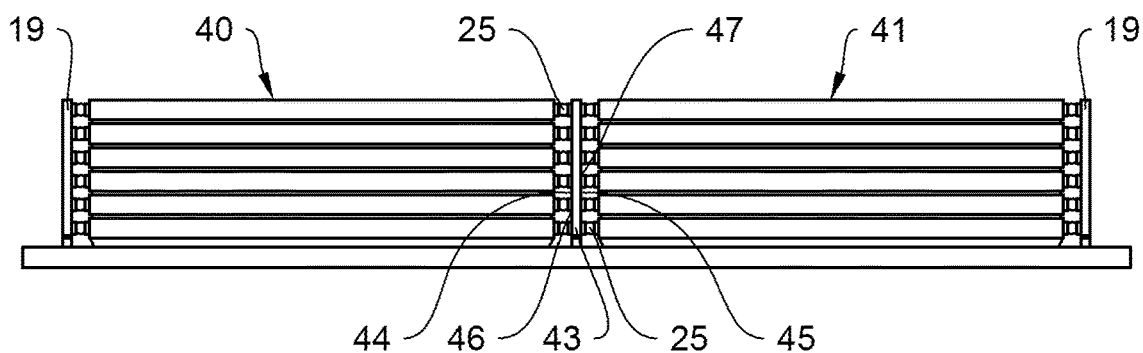
FIG. 5 shows another embodiment of a semiconductor-chip stack package.

FIG. 5 shows a semiconductor-chip stack package 40 which in the case of the illustrated exemplary embodiment comprises two semiconductor-chip stack arrangements 41, 42 which are interconnected by means of a connecting substrate 43 sandwiched between the two stack arrangements 41, 42. For this purpose, connecting substrate 43 comprises two opposing contact surfaces 44, 45 each of which is equipped with substrate terminal faces 46, 47 comprising contact bumps 25 which are made up of connecting material 24 and each serve for connection to side terminal faces 13 of semiconductor chips 11 disposed above one another in stack arrangements 41, 42.

In addition to connecting substrate 43 which connects semiconductor chips 11 of stack arrangements 41, 42, stack arrangements 41, 42 are each equipped with an additional connecting substrate 19 in such a manner that semiconductor-chip stack package 40 comprises each stack arrangement 41, 42 arranged between two connecting substrates 19 and 43, connecting substrate 43 sandwiched between stack arrangements 41, 42 at the same time allowing an electrical connection between stack arrangements 41, 42.

Figure 6:
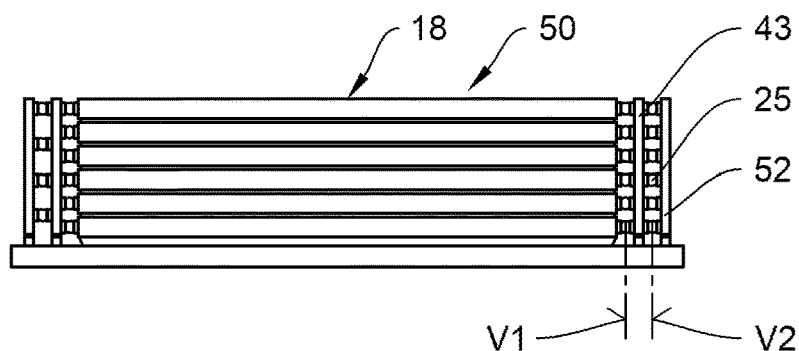
FIG. 6 shows another embodiment of a semiconductor-chip stack package.

FIG. 6 shows a semiconductor-chip stack package 50 which, like semiconductor-chip stack package 10 illustrated in FIG. 1, comprises only one stack arrangement 18, connecting substrates 43 contacted with semiconductor chips 11 of stack arrangement 18 via side terminal faces 41 being equipped with substrate terminal faces 46, 47 on two opposing contact surfaces 44, 45, as described above with reference to FIG. 5, and being connected to an additional substrate 52 in a second connection plane V2 via contact bumps 25 arranged on substrate terminal faces 47, said additional substrate 52 allowing an additional dissipation of heat in semiconductor-chip stack package 50 as a cooling substrate, for example.

Figure 7:
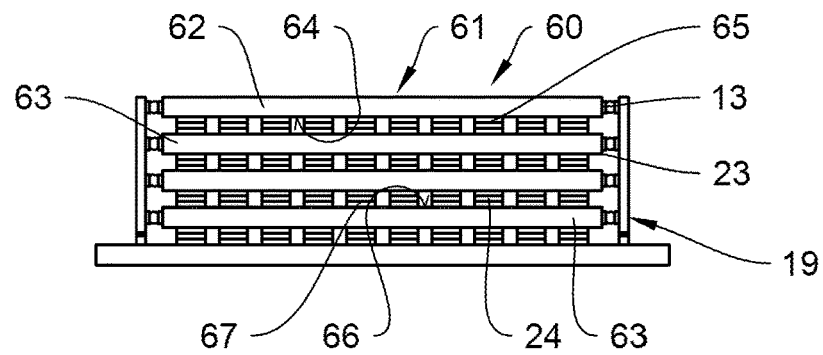
FIG. 7 shows another embodiment of a semiconductor-chip stack package.

FIG. 7 shows a semiconductor-chip stack package 60 for which, unlike in semiconductor-chip stack package 10 illustrated in FIG. 1, one semiconductor chip 62 and semiconductor chips 63 are used for forming a stack arrangement 61, semiconductor chip 62 being equipped with chip terminal faces 65 on its lower side 64 in addition to side terminal faces 13 provided on its side surfaces 23. Semiconductor chips 63 further comprise additional chip terminal faces 67 on their upper side 66 so that connecting material 24 arranged between each chip terminal face 64 and 67 not only enables electrically contacting semiconductor chips 62, 63 to connecting substrate 19 via side terminal faces 13 but also enables directly interconnecting semiconductor chips 62, 63.

Figure 8:
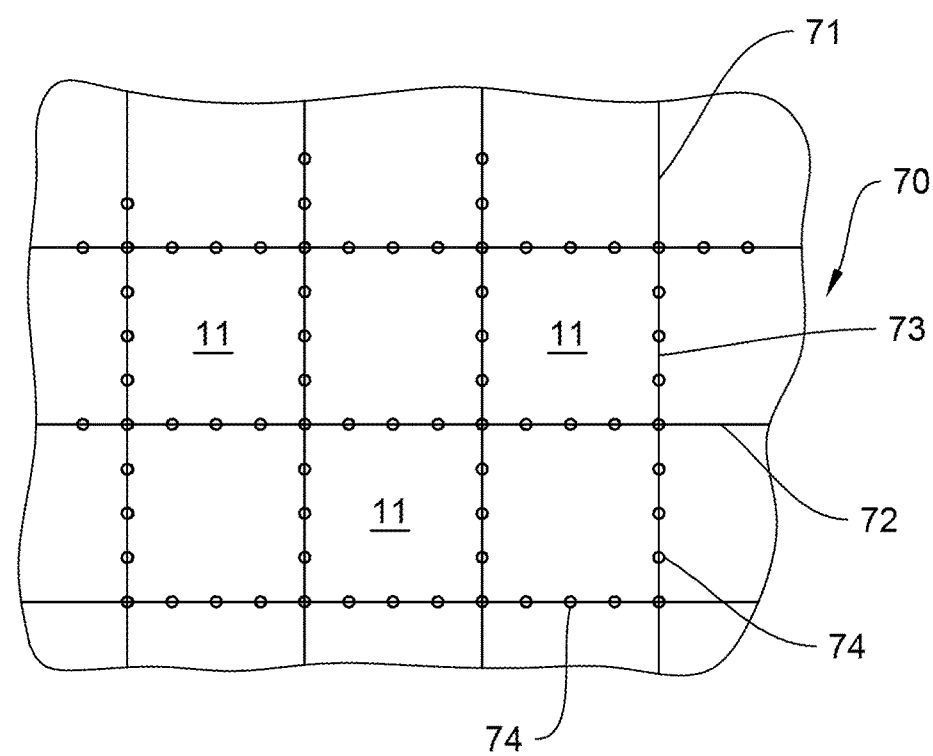
FIG. 8 is a partial top view of a wafer for producing semiconductor chips for realizing the semiconductor-chip stack packages illustrated in FIGS. 1 and 5 to 7.

FIG. 8 shows a schematic illustration of semiconductor chips 11 formed in a wafer 70 before being separated from wafer 70, a separation pattern 71 having perpendicular separating lines 72, 73 being illustrated schematically. Along separating lines 72, 73, chips 11 are separated from wafer 70, connecting bodies 74 which are referred to as through silicon vias (TSV) in professional jargon and are preferably realized like columns in the wafer being formed along separating lines 71, 72. When cutting wafer 70 along separating lines 72, 73, side surfaces 23 of semiconductor chips 11 are formed in the dividing planes extending perpendicular to the illustration plane, the separation surfaces thus formed in connecting bodies 74 forming side terminal faces 13. When profiling a separating tool used for this purpose in a suitable manner, contact recess 26 illustrated in FIGS. 2 and 3 can be formed simultaneously with cutting connecting bodies 74.

The invention claimed is:

1. A semiconductor-chip stack package comprising a plurality of semiconductor chips disposed in a stack arrangement and at least one connecting substrate which connects the semiconductor chips, the semiconductor chips being equipped with at least one chip terminal face on at least one chip edge, said chip terminal face extending at least partially as a side terminal face in a side surface of the semiconductor chip formed on the chip edge, the side surfaces of the semiconductor chips provided with the side terminal face being arranged in a shared side surface plane S of the semiconductor-chip stack arrangement, the connecting substrate being arranged with a contact surface parallel to the side surface plane S of the semiconductor chips and comprising substrate terminal faces which are formed on the contact surface for connecting a connection conductor structure formed in the connecting substrate and which are connected to the side terminal faces in an electrically conductive manner via a connecting material in a connection plane V1 parallel to the contact surface, wherein the side terminal faces are each formed from a separation surface of connecting bodies which are arranged in dividing planes of a wafer and are cut from the wafer for forming the separation surface when separating the semiconductor chips.

2. The semiconductor-chip stack package according to claim 1, wherein the side terminal faces have a contact metallization applied on the side terminal faces after the semiconductor chips have been separated from the wafer.

3. The semiconductor-chip stack package according to claim 1, wherein the side terminal faces have a concave contact surface for forming a contact recess.

4. The semiconductor-chip stack package according to claim 3, wherein the contact surfaces of the adjacent semiconductor chips in the stack arrangement form a contact groove extending along the stacking height.

5. The semiconductor-chip stack package according to claim 3, wherein the connecting material arranged on the substrate terminal faces of the connecting substrate forms convex contact bumps which engage in the contact recess of the side terminal faces.

6. The semiconductor-chip stack package according to claim 1, wherein the semiconductor chips are at least partially equipped with at least one additional chip terminal face on their upper side and/or their lower side in addition to the side terminal faces.

7. The semiconductor-chip stack package according to claim 1, wherein opposite the contact surface, the connecting substrate has a second contact surface having substrate terminal faces for forming a second connection plane V2.

8. The semiconductor-chip stack package according to claim 7, wherein the second connection plane V2 serves for connection to a second stack arrangement of semiconductor chips such that the connecting substrate is sandwiched between the two stack arrangements.

9. The semiconductor-chip stack package according to claim 7, wherein the second connection plane V2 serves for connection to a functional substrate.

10. The semiconductor-chip stack package according to claim 9, wherein the functional substrate is realized as a semiconductor chip.

11. The semiconductor-chip stack package according to claim 9, wherein the functional substrate is realized as a cooling substrate.

12. The semiconductor-chip stack package according to claim 1, wherein spacer elements are arranged between the semiconductor chips for realizing a defined stacking height of the stack arrangement.

13. The semiconductor-chip stack package according to claim 12, wherein the spacer elements are molded bodies in an adhesive mass which connects the semiconductor chips.

14. A semiconductor chip for producing a semiconductor-chip stack package according to claim 1, comprising side terminal faces which are each formed from a separation surface of connecting bodies which are arranged in dividing planes of a wafer and are cut from the wafer for forming the separation surface when separating the semiconductor chips.

15. The semiconductor chip according to claim 14, wherein the side terminal faces have a contact metallization applied on the side terminal faces after the semiconductor chips have been separated from the wafer.

16. The semiconductor chip according to claim 14, wherein the side terminal faces have a concave contact surface for forming a contact recess.

* * * * *